(12) United States Patent
Torii et al.

(10) Patent No.: US 8,921,984 B2
(45) Date of Patent: Dec. 30, 2014

(54) THROUGH SILICON VIA IN SEMICONDUCTOR DEVICE

(71) Applicant: Elpida Memory, Inc., Tokyo (JP)

(72) Inventors: Koji Torii, Tokyo (JP); Nobuyuki Nakamura, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 36 days.

(21) Appl. No.: 13/897,613

(22) Filed: May 20, 2013

(65) Prior Publication Data

US 2013/0313689 A1   Nov. 28, 2013

(30) Foreign Application Priority Data

May 23, 2012  (JP) ................................ 2012-117538

(51) Int. Cl.
*H01L 29/40* (2006.01)
*H01L 23/48* (2006.01)
*H01L 21/768* (2006.01)

(52) U.S. Cl.
CPC ...... *H01L 23/481* (2013.01); *H01L 2224/16146* (2013.01); *H01L 21/76898* (2013.01); *H01L 2224/14181* (2013.01); *H01L 2224/13009* (2013.01)

USPC .......... 257/621; 257/692; 257/698; 257/700; 257/774; 257/E21.597

(58) Field of Classification Search
USPC ........... 257/621, 692, 698, 700, 774, E21.597
See application file for complete search history.

(56) References Cited

U.S. PATENT DOCUMENTS

| | | | |
|---|---|---|---|
| 2011/0304026 A1* | 12/2011 | Tsui et al. ..................... | 257/621 |
| 2011/0316124 A1* | 12/2011 | Kawano ........................ | 257/621 |
| 2012/0098106 A1* | 4/2012 | Aoki et al. .................... | 257/621 |
| 2012/0104562 A1* | 5/2012 | Pagaila et al. ................ | 257/621 |
| 2012/0112324 A1* | 5/2012 | Huang .......................... | 257/621 |

FOREIGN PATENT DOCUMENTS

JP        2010-272737        12/2010

* cited by examiner

*Primary Examiner* — Thanh V Pham
(74) *Attorney, Agent, or Firm* — Young & Thompson

(57) ABSTRACT

In a connecting portion between an interconnection and a first bump which is a part of a through electrode penetrating a semiconductor chip and which penetrates a semiconductor substrate, a protruding portion protruding from the interconnection to the side of the first bump is provided. The protruding portion may be made of an insulating material and may be made of a conductive material.

20 Claims, 13 Drawing Sheets

THROUGH SILICON VIA IN SEMICONDUCTOR DEVICE

BACKGROUND OF THE INVENTION

1. Field of the Invention

The present invention relates to a semiconductor device, and more particularly to a semiconductor device provided with a through electrode.

2. Description of the Related Art

In recent years, a Through Silicon Via (hereinafter referred to as TSV) formed by burying an conductive material into a through hole provided in silicon of a semiconductor substrate has been used as a mounting technique for realizing high-integration and high-speed semiconductor devices. The TSV is an electrode penetrating perpendicularly through a semiconductor substrate and is usually formed as a rear bump on the rear side of the semiconductor substrate. An interconnection connected to the rear bump, a front bump connected to the interconnection, which are formed on the front side of the semiconductor substrate, and the rear bump are collectively referred to a through electrode. By mutually connecting the exposed terminals of the through electrodes (the front bump and the rear bump) in stacked semiconductor chips, the degree of integration per unit area occupied by a semiconductor device is improved, and also an interconnection length between the respective semiconductor chips is reduced to thereby increase the operation speed of the semiconductor device. The TSV is connected to a conductive layer (hereinafter referred to as wiring pad) in a semiconductor chip at one end portion (hereinafter referred to as an inner terminal) of a TSV in a semiconductor substrate and is further connected to semiconductor elements of an integrated circuit via the wiring pad (see JP2010-272737A).

Here, the inner terminal of the TSV and the wiring pad in the related art are formed in parallel with the surface of the semiconductor substrate, and are each formed in a flat shape. In this configuration, there has been a case where, when the TSV is expanded or contracted due to heat stress applied in a subsequent step, a gap (void) is generated in the joint surface between the TSV and the wiring pad, so as to increase the electric resistance at the joint surface.

SUMMARY

That is, according to one embodiment of the present invention, there is provided a semiconductor device including:

a semiconductor substrate;

a first bump penetrating from a first surface of the semiconductor substrate to a second surface of the semiconductor substrate facing the first surface, the first bump being exposed to the side of the second surface;

an interconnection formed on the first surface of the semiconductor substrate, the interconnection being connected to the first bump, an interlayer insulating covering the interconnection;

a second bump provided on the interlayer insulating film, the second bump being connected to the interconnection and exposed to the side of the first surface; and a protruding portion provided at a connecting portion between the first bump and the interconnection, the protruding portion fitting into the first bump.

According to another embodiment of the present invention, there is provided a semiconductor device including:

a semiconductor substrate;

a through-via penetrating from a first surface of the semiconductor substrate to a second surface of the semiconductor substrate facing the first surface, the through-via having a subdivided inner terminal formed in a convexo-concave shape;

an interconnection formed on the first surface of the semiconductor substrate, the interconnection being in contact with at least a convex portion of the subdivided inner terminal of the through-via in a connecting portion between the through-via and the interconnection;

an interlayer insulating film covering the interconnection; and a fitting member provided on the lowermost portion of the interconnection, the fitting member being embedded in a concave portion of the subdivided inner terminal of the through-via.

In the semiconductor device according to the present invention, the inner terminal of the TSV is formed into a convexo-concave shape by providing protruding portions at the side of the interconnection, and thereby the contraction due to heat stress can be suppressed.

Further, the protruding portions are inserted like wedges into the TSV, and thereby the mechanical strength can be improved.

BRIEF DESCRIPTION OF THE DRAWINGS

The above features and advantages of the present invention will be more apparent from the following description of certain preferred embodiments taken in conjunction with the accompanying drawings, in which:

FIG. 13A to FIG. 13E are process sectional views for explaining manufacturing steps of semiconductor device 400 according to the still another exemplary embodiment of the present invention;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

A configuration and a manufacturing method of a semiconductor device according to an exemplary embodiment will be described by using, as an example, a case where the semiconductor device is a DRAM (Dynamic Random Access Memory).

Figure 1:
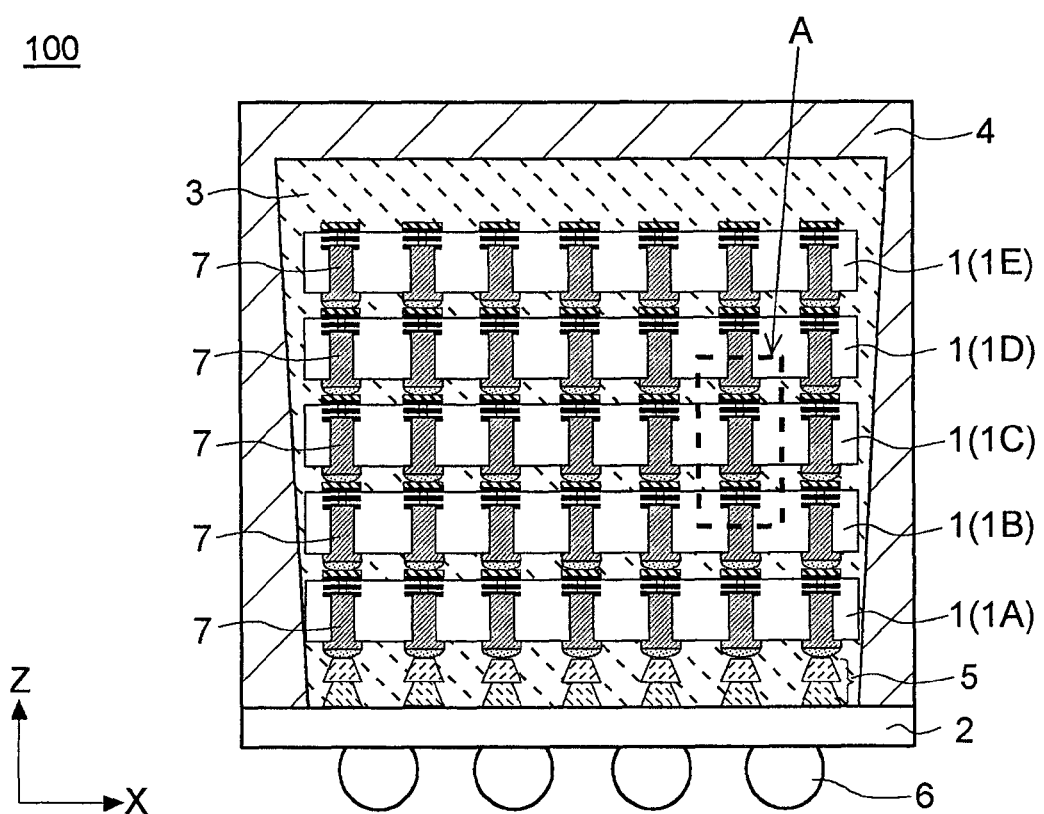
FIG. 1 is a schematic sectional view showing a configuration of semiconductor package 100 which is an exemplary embodiment of the present invention.

FIG. 1 is a schematic sectional view showing a configuration of semiconductor package 100 which houses therein a semiconductor device according to the exemplary embodiment. Here, it is assumed that a silicon substrate is used as a semiconductor substrate serving as a base in the semiconductor device according to the exemplary embodiment. Further, not only a single semiconductor substrate but also a semiconductor substrate in a process of manufacturing thereon a semiconductor device as well as a semiconductor substrate with a semiconductor device already formed thereon are collectively referred to as a wafer. Further, a single semiconductor device of the exemplary embodiment, which is cut out from the wafer, is collectively referred to as a semiconductor chip.

As shown in FIG. 1, semiconductor package 100 is configured by five semiconductor chips 1 (1A to 1E), printed circuit board 2, underfill material 3, molding material 4, base bump 5, and solder ball 6. The respective semiconductor chips are stacked in the package, and are connected to printed circuit board 2 by base bump 5. Also, semiconductor chips 1 are completely surrounded by molding material 4, and further, the gaps between respective semiconductor chips 1 and the gaps between each of semiconductor chips 1 and molding material 4 are filled with underfill material 3. Note that semiconductor package 100 is connected to a mount board via solder ball 6.

Through electrode 7 is used for electrically connecting stacked semiconductor chips 1 to each other, and the structure of through electrode 7 in a DRAM will be described with reference to FIG. 2A and FIG. 2B in which dashed region A of FIG. 1 is enlarged.

First Exemplary Embodiment

Figures 2A, 2B:
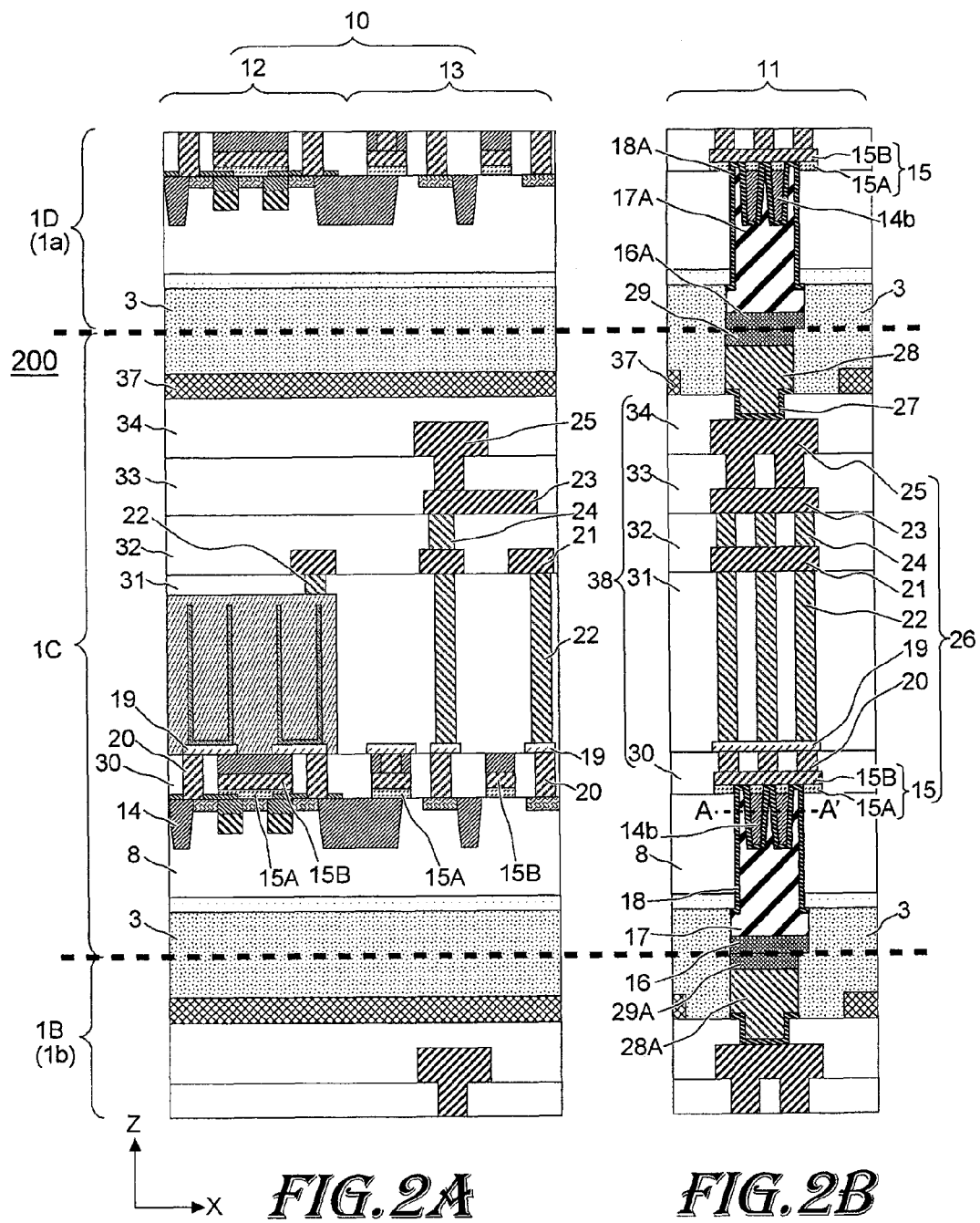
FIG. 2A and FIG. 2B are enlarged sectional views respectively showing a semiconductor element area and a TSV area in region A in FIG. 1 and which includes semiconductor device 200 of the exemplary embodiment of the present invention.

FIG. 2A and FIG. 2B each shows a state in which semiconductor chip 1D and semiconductor chip 1B have the same structure as that of semiconductor chip 10 that is semiconductor device 200 according to the exemplary embodiment, and in which lower portion 1a of semiconductor chip 1D and upper portion 1b of semiconductor chip 1B are stacked on and under semiconductor chip 10. FIG. 2A is a sectional view of semiconductor element area 10, and FIG. 2B is a sectional view of a through electrode area (hereinafter referred to as TSV area 11). Here, FIG. 2A and FIG. 2B are shown side by side to thereby clarify the positional relationship between the respective components. Note that, hereinafter, the stacked configuration of the semiconductor chips including through electrodes 7 is referred to as a semiconductor device.

As shown in FIG. 2A and FIG. 2B, semiconductor device 200 in semiconductor chip 1 is configured by semiconductor element area 10 and TSV area 11, and semiconductor element area 10 is configured by cell array region 12 and peripheral circuit region 13. TSV area 11 is provided at the outer peripheral region of semiconductor element area 10, but here, only right TSV area 11 is shown for convenience of explanation. A DRAM as a semiconductor memory device is illustrated in semiconductor element area 10 but semiconductor element area 10 is not limited to the memory device. In semiconductor element area 10, a logic element can be provided, and also a memory element and a logic element can be intermingled. Note that the configuration of the semiconductor device in semiconductor element area 10 is a known configuration of a memory element or a logic element. Through electrode 7 in TSV area 11 is mainly configured by rear bump 17 which is a copper (Cu) electrode formed to penetrate silicon substrate 8, interconnection 26, and front bump 28 which is a copper electrode. Note that in a semiconductor chip which is stacked as an uppermost layer as in the case of semiconductor chip 1E shown in FIG. 1, front bump 28 may be omitted. Rear bump 17 is formed to penetrate silicon substrate 8, and hence may be referred to as a through-via. First seed film 18 formed by successively stacking titanium (Ti) and copper (Cu) is provided on the upper side of rear bump 17 in the figure. The lower side of rear bump 17 in the figure is covered with rear plating layer 16 mainly composed of nickel (Ni). Rear plating layer 16, rear bump 17, and first seed film 18 may be collectively referred to as a first bump. The upper side of rear bump 17 in the figure, which is an inner terminal having a convexo-concave shape, is in contact with protruding portion (also called as a fitting member) 14b including the same insulating material of STI (Shallow Trench Isolation) 14 via first seed film 18, and is also connected to first wiring 15 serving as a wiring pad. STI 14 is formed of a silicon nitride film to partition an active area. Protruding portion 14b includes an insulating material portion formed simultaneously with STI 14 formed in semiconductor element area 10, and a part of a conductive material portion of lower layer first wiring 15A, and has a side surface inclined with respect to the Z direction perpendicular to the X direction in which the upper surface of silicon substrate 8 extends. That is, the widths of the upper and lower surfaces of protruding portion 14b are different from each other, and as shown in FIG. 2, protruding portion 14b is configured such that the width of the lower side in the figure (a second width) is less than the width of the upper side in the figure (a first width). Further, protruding portion 14b may also be configured such that the second width is greater than the first width. More specifically, the inner terminal formed as one end portion of rear bump 17 configuring TSV 7 is subdivided to have a convex-concave shape. In the concave portion of rear bump 17, protruding portion 14b formed of STI is embedded like a wedge via first seed film 18, so as to be fitted into rear bump 17. Further, the convex portion of rear bump 17 is connected, via first seed film 18, to first wiring 15 configuring a part of interconnection 26, and also the outer peripheral portion of rear bump 17 is connected to silicon substrate 8 via first seed film 18. Note that lower layer first wiring 15A made of polysilicon, and upper layer first wiring 15B made of tungsten (W) are stacked together to form first wiring 15. Further, for the purpose of insulation and isolation from semiconductor element area 10, and for the purpose of prevention of metal diffusion from rear bump 17, an annular insulating isolation portion is provided around rear bump 17 which is formed to penetrate silicon substrate 8, but the annular insulating isolation portion is not illustrated here.

Figure 3:
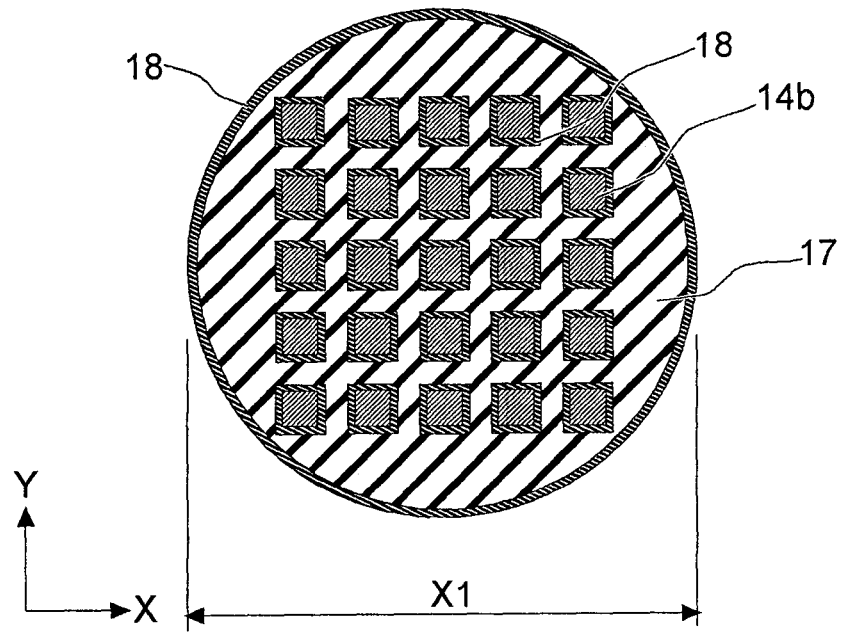
FIG. 3 is a view showing a structure of an inner terminal of a rear bump of semiconductor device 200 and is a cross sectional view along line A-A' of FIG. 2B.
Figure 4:
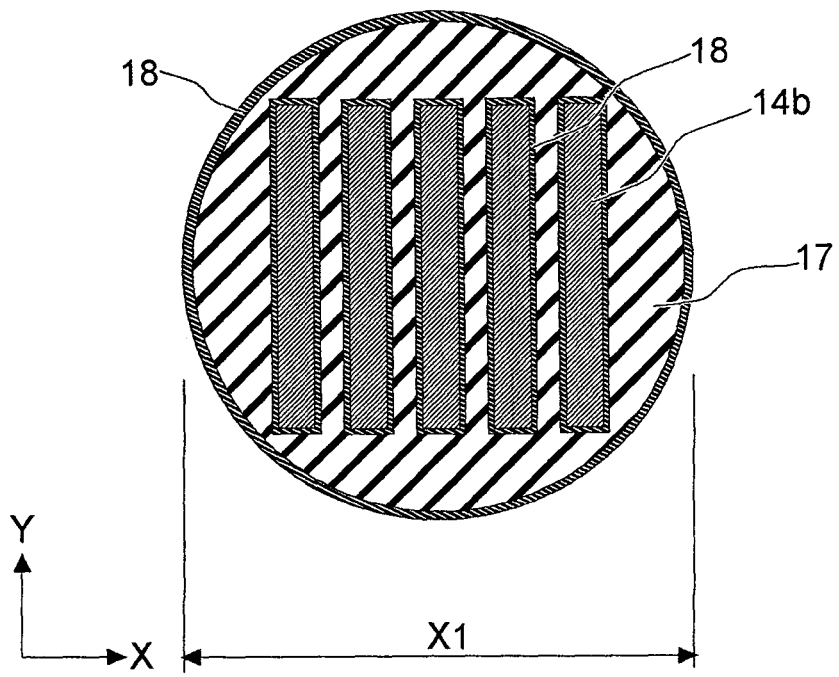
FIG. 4 is a view showing another structure of the inner terminal of the rear bump of semiconductor device 200 and is a cross sectional view along line A-A' of FIG. 2B.

Next, the structure of the inner terminal will be described with reference to FIG. 3 which is a cross sectional view along line A-A' of FIG. 2B. Protruding portion 14b in FIG. 3 is formed into a rectangular shape, and a plurality of protruding portions 14b are arranged in a grid shape in the X and Y directions within diameter X1 of rear bump 17. Rear bump 17 is provided, via first seed film 18, between protruding portions 14b adjacent to each other, and the inner terminal of rear bump 17 is formed in a convexo-concave shape by protruding portions 14 adjacent to each other in the X and Y directions. The arrangement of protruding portions 14b is not limited to the grid shape shown in FIG. 3. Protruding portions 14b can be formed in a line shape continuous in one direction such as the Y direction as shown in FIG. 4, and may also be formed in a shape in which the grid shape and the line shape are arranged in a mixed state.

As shown in FIG. 2B, second seed film 27 formed by successively stacking titanium (Ti) and copper (Cu) is provided on the lower surface of front bump 28, and the upper surface of front bump 28 is covered by front plating layer 29 which is an alloy containing tin (Sn) as a main component. Second seed film 27, front bump 28, and front plating layer 29 may be collectively referred to as a second bump. Interconnection 26 is configured by first wiring 15, capacitive pad 19 made of tungsten (W), aluminum (Al), and the like, second wiring 21, third wiring 23, and fourth wiring 25, and first contact plug 20, second contact plug 22, and third contact plug 24 which are made of tungsten so as to electrically connect second wiring 21, third wiring 23, and fourth wiring 25 to each other. The components of interconnection 26 are not each independently provided but are provided simultaneously with the components of semiconductor element area 10 by using the same materials as those of the components of semiconductor element area 10. Further, the components of interconnection 26 are insulated from the components of semiconductor element area 10 by first interlayer insulating film 30, second interlayer insulating film 31, third interlayer insulating film 32, fourth interlayer insulating film 33, and fifth interlayer insulating film 34, each of which insulating films is a silicon oxide film or a silicon nitride film. Further, fifth interlayer insulating film 34 of semiconductor element area 10 is covered with passivation film 37 made of resin which is represented by polyimide and which has heat resistance. Further, in the following, first interlayer insulating film 30 to fifth interlayer insulating film 34 are collectively referred to as TSV insulating film 38. TSV insulating film 38 including these films is also formed simultaneously with those of semiconductor element area 10 by using the same materials. Exposed front bump 28 is bulged outward the upper surface of semiconductor device 200 in semiconductor chip 1 provided with these components, and exposed rear bump 17 is bulged outward the lower surface of semiconductor device 200. In a state where exposed front bump 28 and exposed rear bump 17 are provided in this way, rear bump 17A of semiconductor chip 1D stacked on the upper side of semiconductor chip 10 is connected to front bump 28 of semiconductor chip 10 via rear plating layer 16A and front plating layer 29. Front bump 28A of semiconductor chip 1B stacked on the lower side of semiconductor chip 10 is similarly connected to rear bump 17 of semiconductor chip 10 via rear plating layer 16 and front plating layer 29A. Underfill material 3 is filled in the space around all of semiconductor chips 1A to 1E. Thereby, the intrusion of molding material 4 is prevented, so that TSV 7 and base bump 5 are protected.

As described above, in semiconductor device 200 of the exemplary embodiment, one end portion of rear bump 17 configuring TSV 7 is subdivided to have a convexo-concave shape. Further, protruding portion 14b is embedded, like a wedge, into the concave portion of subdivided rear bump 17, and first wiring 15 configuring a part of interconnection 26 is connected to the convex portion of subdivided rear bump 17. With this configuration, the contraction amount due to heat stress is reduced in the one end portion of subdivided rear bump 17. Further, protruding portion 14b is fitted, like a wedge, into the concave portion, so that the connection strength between rear bump 17 and first wiring 15 is improved. As a result, generation of a gap in the joint surface is suppressed, and thereby it is possible to avoid the problem of the related art that the electric resistance at the joint surface is increased.

Second Exemplary Embodiment

Figures 5A, 5B:
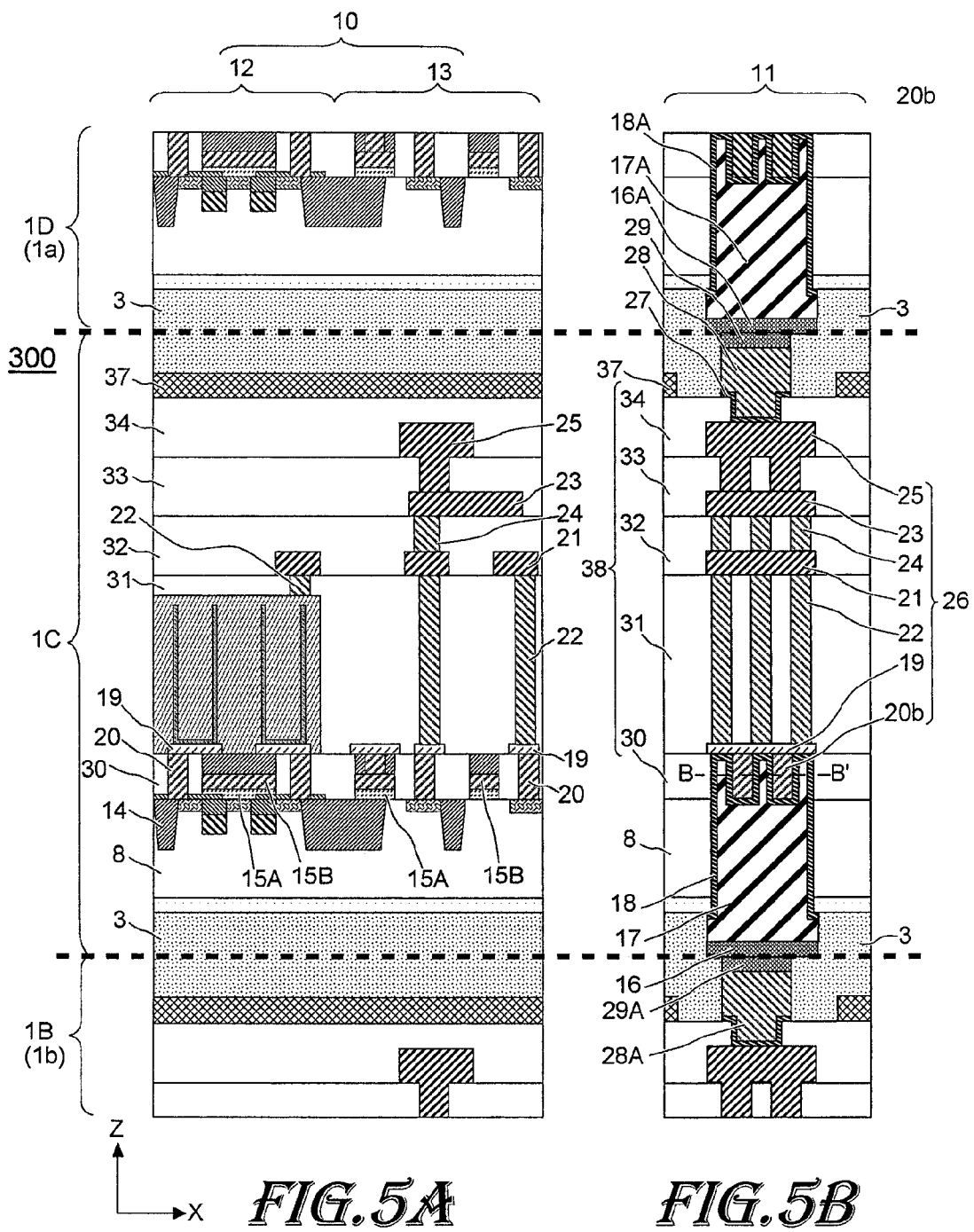
FIG. 5A and FIG. 5B are enlarged sectional views respectively showing a semiconductor element area and a TSV area in region A in FIG. 1 and which includes semiconductor device 300 of another exemplary embodiment of the present invention.

In this exemplary embodiment, semiconductor device 300, in which the rear bump is connected to a capacitive pad and a first contact plug, will be described with reference to FIG. 5A and FIG. 5B. The configuration shown in FIG. 5A is the same as that of FIG. 2A, and hence the description of the configuration is omitted. Further, FIG. 5B is partially the same as FIG. 2B, and hence the description of overlapping portions is omitted.

As shown in FIG. 5B, the upper surface of rear bump 17 is configured as an inner terminal formed in a convexo-concave shape, and is connected, via first seed film 18, to protruding portion 20b formed of first contact plug 20 and to capacitive pad 19 serving as a wiring pad. Protruding portion 20b has a side wall extending in the Z direction perpendicular to the X direction in which the upper surface of silicon substrate 8 extends. More specifically, the inner terminal formed as one end portion of rear bump 17 configuring TSV 7 is subdivided to have a convexo-concave shape. In the concave portion, protruding portion 20b is embedded, like a wedge, via first seed film 18. Further, the convex portion of rear bump 17 is also connected, via first seed film 18, to capacitive pad 19 configuring interconnection 26, and the outer peripheral portion of rear bump 17 is connected, via first seed film 18, to silicon substrate 8 and first interlayer insulating film 30.

Figure 6:
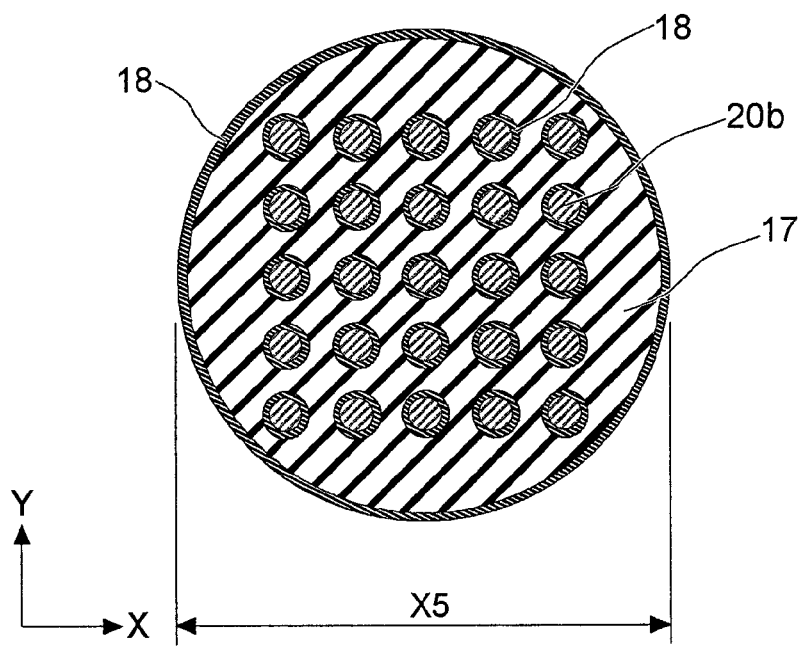
FIG. 6 is a view showing a structure of an inner terminal of a rear bump of semiconductor device 300 and is a cross sectional view along line B-B' of FIG. 5B.
Figure 7:
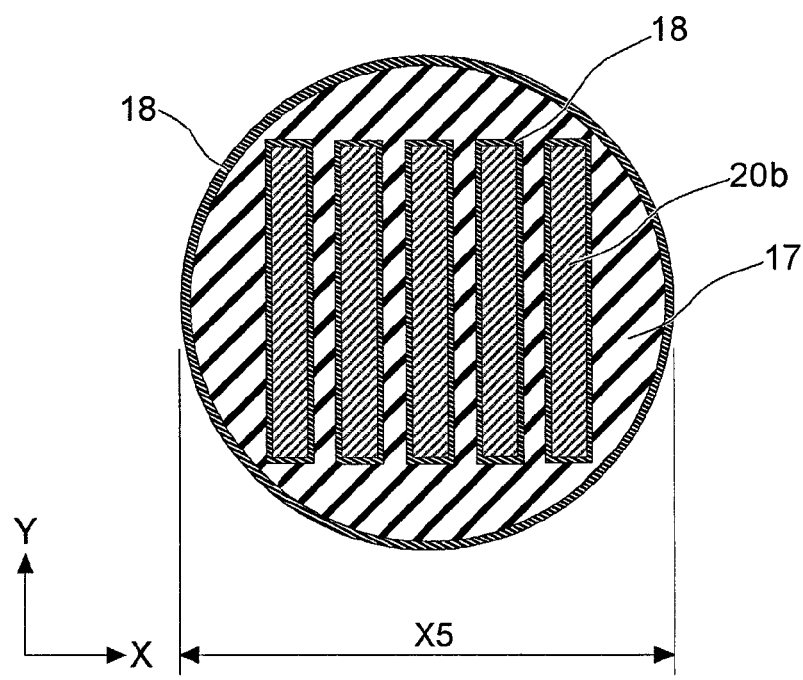
FIG. 7 is a view showing another structure of the inner terminal of the rear bump of semiconductor device 300 and is a cross sectional view along line B-B' of FIG. 5B.

Next, the structure of the inner terminal will be described with reference to FIG. 6 which is a cross sectional view along line B-B' of FIG. 5B. Protruding portion 20b in FIG. 6 is formed into a circular shape, and a plurality of protruding portions 20b are arranged in a grid shape in the X and Y directions within diameter X5 of rear bump 17. Rear bump 17 is provided, via first seed film 18, between protruding portions 20b adjacent to each other, and the upper portion of rear bump 17 is formed in a convexo-concave shape by protruding portions 20b formed of first contact plugs 20 adjacent to each other in the X and Y directions. The arrangement of protruding portions 20b is not limited to the grid shape shown in FIG. 6. Protruding portions 20b can be formed in a line shape continuous in the Y direction as shown in FIG. 7, and may also be formed in a shape in which the grid shape and the line shape are arranged in a mixed state.

Note that the other configuration is the same as the configuration of the first exemplary embodiment, and hence description thereof is omitted.

As described above, in semiconductor device 300 of the exemplary embodiment, one end portion of rear bump 17 configuring TSV 7 is subdivided to have a convexo-concave shape. Further, protruding portion 20b is fitted, like a wedge, into the concave portion of subdivided rear bump 17, and capacitive pad 19 configuring a part of interconnection 26 is connected to the convex portion of subdivided rear bump 17. With this configuration, the contraction amount due to heat stress is reduced in the one end portion of subdivided rear bump 17. Further, protruding portion 20b is embedded, like a wedge, into the concave portion of rear bump 17, so that the connection strength between rear bump 17 and capacitive pad 19 is improved. As a result, generation of a gap in the joint surface is suppressed, and thereby it is possible to avoid the problem of the related art that the electric resistance at the joint surface is increased. Further, in semiconductor device 300 of this exemplary embodiment, protruding portion 20b, which is embedded like a wedge, is itself formed of a conductor, and thereby the electrical connection area of rear bump 17 is expanded as compared with the first exemplary embodiment in which the protruding portion includes an insulating material of STI. As a result, semiconductor device 300 has a structure in which, even when fine gaps are locally formed, the electric resistance at the joint surface is hardly changed.

Third Exemplary Embodiment

Figure 8:
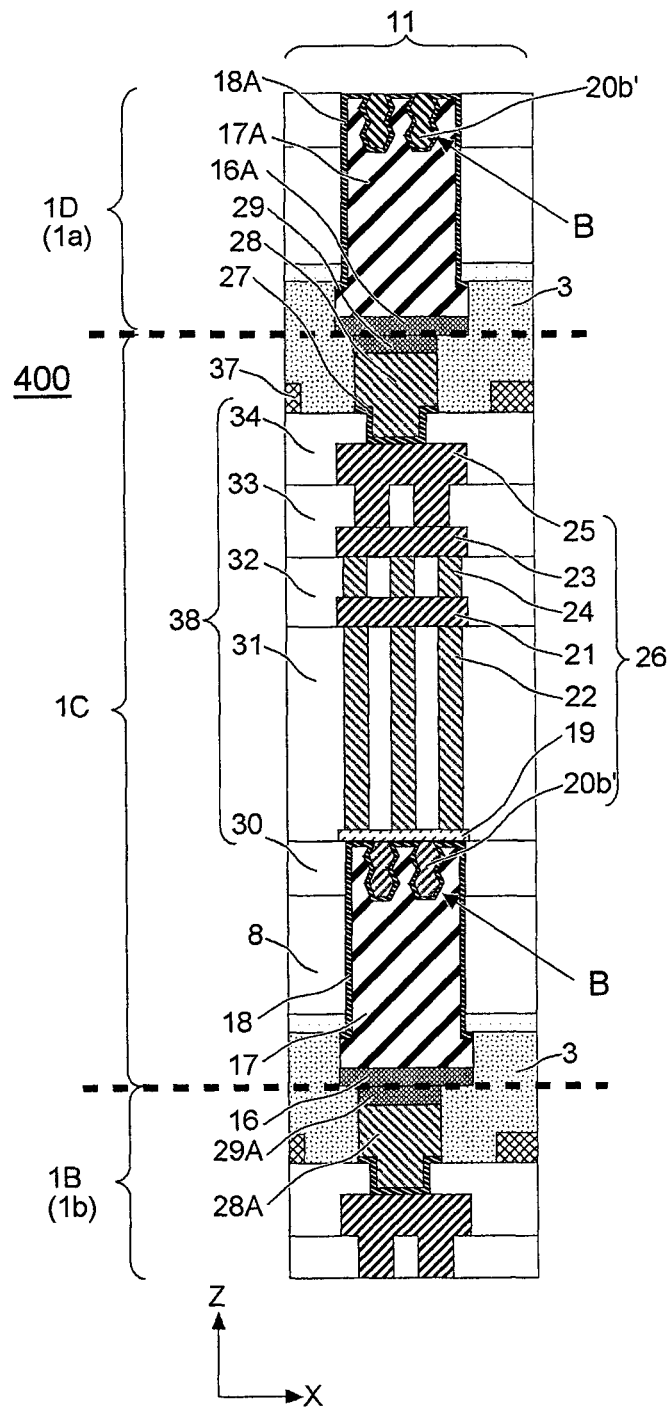
FIG. 8 is a partially enlarged view showing region A in FIG. 1, which includes semiconductor device 400 of still another exemplary embodiment of the present invention, and is a view showing a TSV area.

In this exemplary embodiment, semiconductor device 400, in which the rear bump is connected to capacitive pad 19 and protruding portion 20b' formed of first contact plug 20, and in which the surface of protruding portion 20b' is roughed into an uneven shape, will be described with reference to FIG. 8. The configuration of FIG. 8 is partially the same as that of FIG. 5B, and hence description of overlapping portions is omitted. The configuration of FIG. 8 is different from that of FIG. 5B only in the configurations of protruding portion 20b', first seed film 18, and rear bump 17.

As shown in FIG. 8, the upper surface of rear bump 17 is configured as an inner terminal formed in a convexo-concave shape, and is connected, via first seed film 18, to protruding portion 20b' formed of first contact plug 20 and to capacitive pad 19 serving as a wiring pad. More specifically, the inner terminal formed as one end portion of rear bump 17 configuring TSV 7 is subdivided to have a convexo-concave shape. Protruding portion 20b' whose upper and side surfaces are formed into an uneven shape (denoted by reference character B in FIG. 8) is embedded, like a wedge, into the concave portion of rear bump 17 via first seed film 18. Further, the convex portion of rear bump 17 is also connected, via first seed film 18, to capacitive pad 19 configuring a part of interconnection 26, and the outer peripheral portion of rear bump 17 is connected, via first seed film 18, to silicon substrate 8 and first interlayer insulating film 30.

Note that the other configuration is the same as the configuration of the second exemplary embodiment, and hence description thereof is omitted.

As described above, in semiconductor device 400 of this exemplary embodiment, one end portion of rear bump 17 configuring TSV 7 is subdivided to have a convexo-concave shape. Further, protruding portion 20b', which is formed of first contact plug 20 whose upper and side surfaces are formed in an uneven shape, is embedded, like a wedge, into the concave portion of subdivided rear bump 17, and further capacitive pad 19 configuring interconnection 26 is connected to the convex portion of subdivided rear bump 17. With this configuration, the contraction amount due to heat stress is reduced in the one end portion of subdivided rear bump 17. Further, protruding portion 20b' is embedded, like a wedge, so that the connection strength between rear bump 17 and capacitive pad 19 is improved. As a result, generation of a gap in the joint surface is suppressed, and thereby it is possible to avoid the problem of the related art that the electric resistance at the joint surface is increased. Further, as compared with the second exemplary embodiment, semiconductor device 400 of this exemplary embodiment has a structure in which the surface of protruding portion 20b', embedded like a wedge, is formed into an uneven shape so that the connection surfaces are engaged with each other. As a result, at the joint surface of the structure, the connection strength is further increased, and the gap is more hardly generated.

Manufacturing Examples

Next, manufacturing steps of the semiconductor device according to an exemplary embodiment will be described with reference to FIG. 9.

Figure 9:
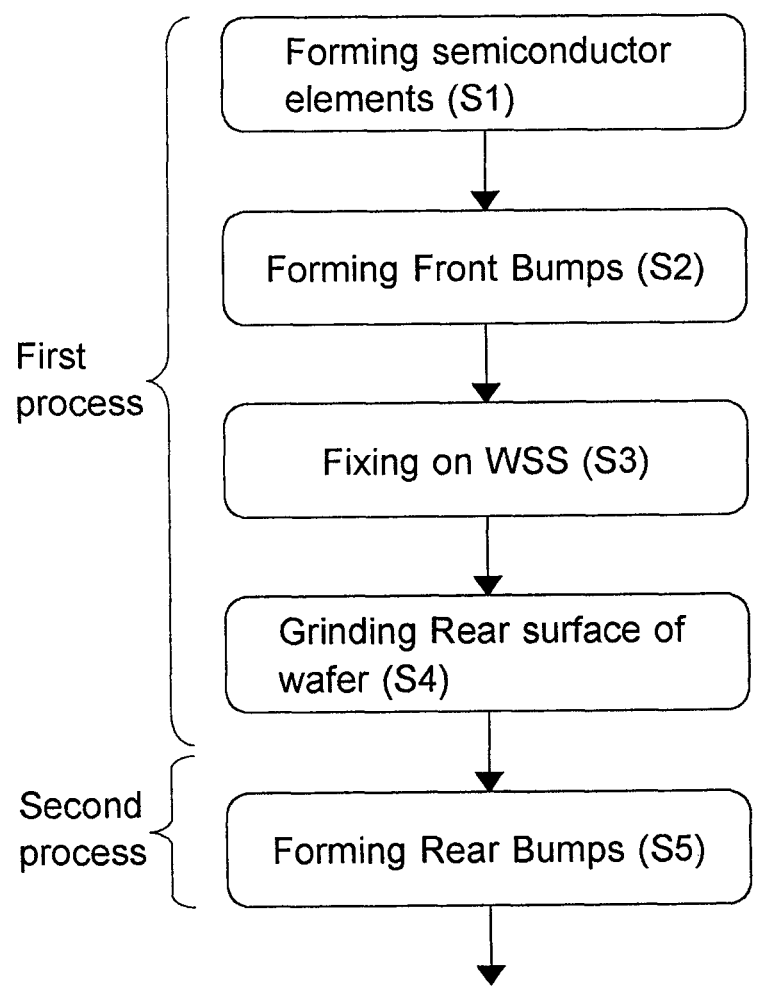
FIG. 9 is a manufacturing flow showing main steps for manufacturing the semiconductor device of the exemplary embodiment of the present invention.

FIG. 9 is a manufacturing flow showing main steps for manufacturing the semiconductor device according to any of the exemplary embodiments. Note that reference numerals in the following description are also used in FIG. 2A and FIG. 2B, and hence the following detailed description is made with reference to the description of FIG. 2A and FIG. 2B.

The manufacturing flow of FIG. 9 is mainly classified into first and second processes. The first process includes steps that are performed in a state where the first (front) surface of the silicon substrate is set to face upward, and the second process includes steps that are performed in a state where the second (rear) surface of the silicon substrate is set to face upward. Here, the first surface of the semiconductor substrate is a surface on which semiconductor elements are provided, and the second surface is a surface of the side opposite to the first surface of the semiconductor device.

In the first process, semiconductor elements are first formed on the first surface of silicon substrate 8 (forming semiconductor elements: S1). In step S1, semiconductor elements are formed in memory cell region 12 and peripheral circuit region 13 of silicon substrate 8, but interconnection 26 is also formed in TSV area 11 by the same manufacturing method as that of the semiconductor elements. Next, front bump 28 and front plating layer 29 are formed on the upper surface of fourth wiring 25 configuring a part of interconnection 26 (forming front bumps: S2). In step S2, after second seed film 27 is formed on the upper surface of fourth wiring 25 by using a sputtering method, front bump 28 and front plating layer 29 are formed on the upper surface of second seed film 27 by using a plating method. Next, by an adhesive layer, a support substrate (wafer support system: WSS), which is made of glass and which has the same diameter as that of silicon substrate 8, is stuck on the first surface side of silicon substrate 8 (wafer) so as to cover front plating layer 29 and passivation film 37 (fixing on WSS: S3). Further, the rear surface of silicon substrate 8 is ground to reduce the thickness of silicon substrate 8 (grinding rear surface of wafer: S4). When the rear surface of silicon substrate 8 is ground, the support substrate plays a role of preventing contaminant foreign matter from adhering to front bump 28, and the like, formed on the side of the first surface of silicon substrate 8, and also plays a role of compensating the mechanical strength of silicon substrate 8 which is made thin by the grinding step. The roles of the support substrate are the same also in the subsequent second process.

In the second process, rear bump 17 is formed on the rear surface of silicon substrate 8 (forming rear bumps: S5). Note that in practice, silicon substrate 8 is reversed to make the rear surface face upward and then rear bump 17 is formed on the rear surface.

Next, manufacturing steps of semiconductor device 200 according to the first exemplary embodiment will be described. However, the description of the steps up to the formation of the front bump is omitted, and the manufacturing step of the rear bump will be described with reference to FIG. 10A to FIG. 10D, FIG. 11, and FIG. 12.

Figure 11:
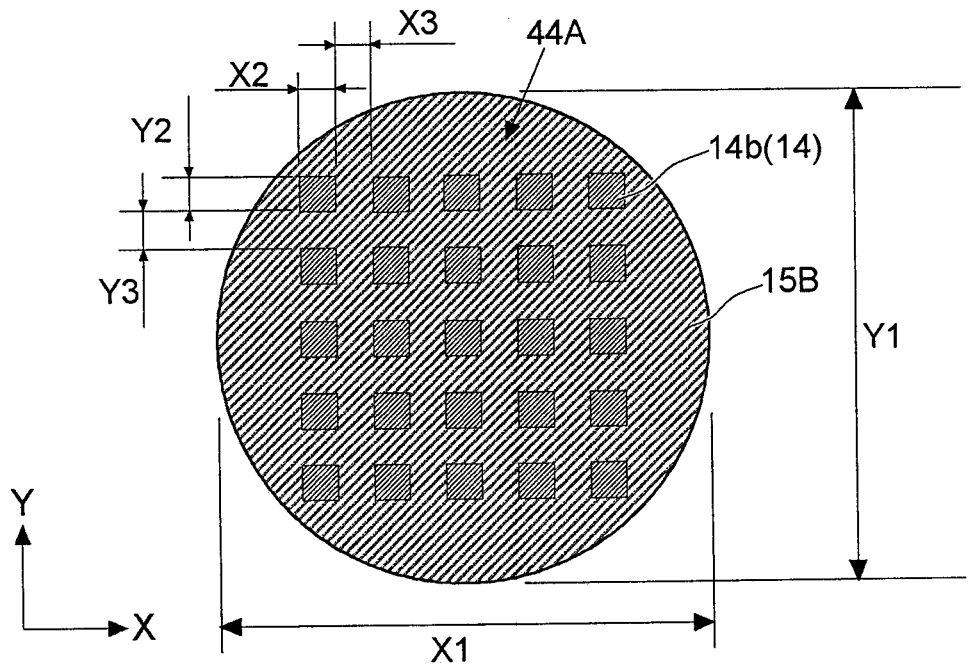
FIG. 11 is a view showing an example of arrangement of protruding portion 14b (STI 14) in the plan view of the inside of bump hole 44A of FIG. 10B.
Figure 12:
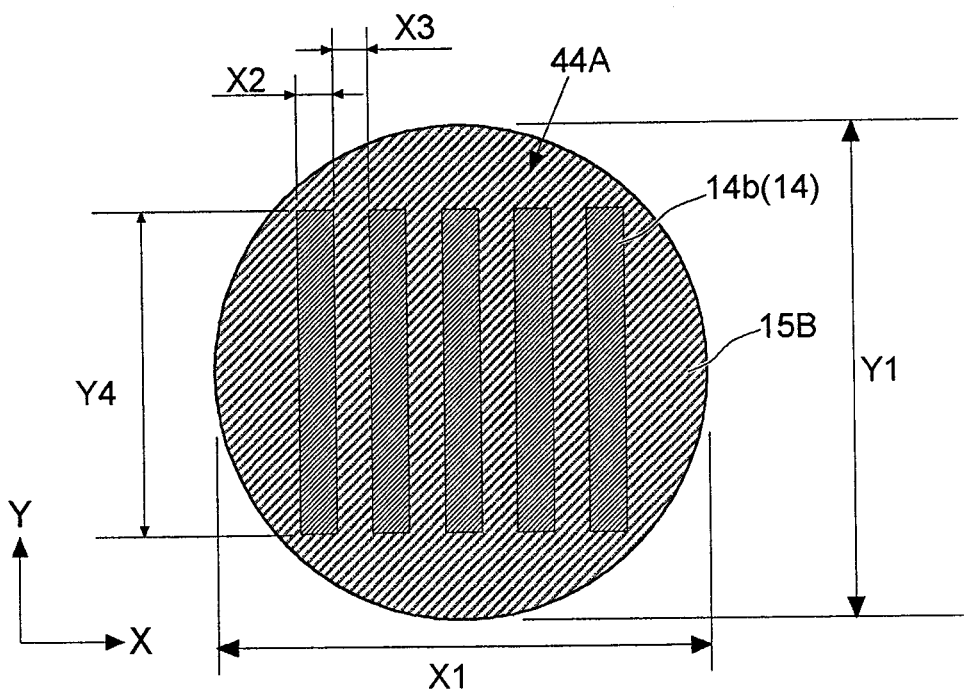
FIG. 12 is a view showing another example of arrangement of protruding portion 14b (STI 14) in the plan view of the inside of bump hole 44A of FIG. 10B.

Each of FIG. 10A to FIG. 10D is a cross sectional view which shows each of the manufacturing steps of semiconductor device 200 shown in the first exemplary embodiment, and in which only TSV area 11 in FIG. 2B is extracted and shown. In order to explain the manufacturing steps of rear bump 17 configuring the TSV of semiconductor device 200, each of these cross sectional views is illustrated so that the rear surface of silicon substrate 8 faces upward. Further, most part of interconnection 26 is omitted. Each of FIG. 11 and FIG. 12 shows an example of arrangement of protruding portions 14b (STI 14) in the plan view of the inside of bump hole 44A in FIG. 10B.

Figure 10A:
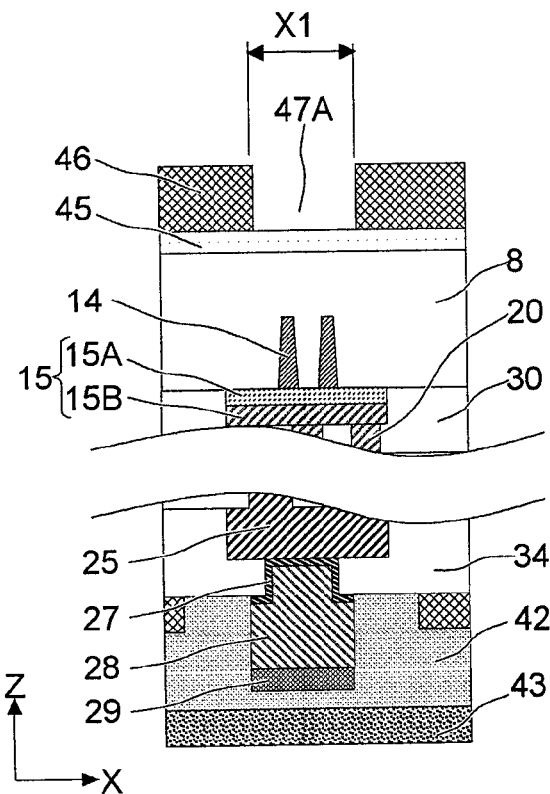
FIG. 10A to FIG. 10D are process sectional views for explaining manufacturing steps of semiconductor device 200 according to the exemplary embodiment of the present invention.

As shown in FIG. 10A, front bump 28 is formed under fourth wiring 25 configuring a part of interconnection 26 shown in FIG. 2B, and the lower surface of front bump 28 is covered with front plating layer 29. Further, front bump 28 and front plating layer 29 are covered with adhesive layer 42 stuck to support substrate 43. Further, a plurality of STIs 14 formed simultaneously with STIs in the semiconductor element area 10 are arranged in silicon substrate 8, and the upper surface (bottom surface in the figure) of STI 14 is in contact with lower layer first wiring 15A.

By using a CVD method, insulating film 45, which is mainly composed of a silicon nitride film, is formed on the rear surface of silicon substrate 8. Further, photoresist 46 is applied on insulating film 45, and first opening 47A having a circular shape in the plan view is formed by a photolithography method. The opening dimension X1 of first opening 47A is set to 11 μm. A part of insulating film 45 is exposed at the bottom of first opening 47A.

Figure 10B:
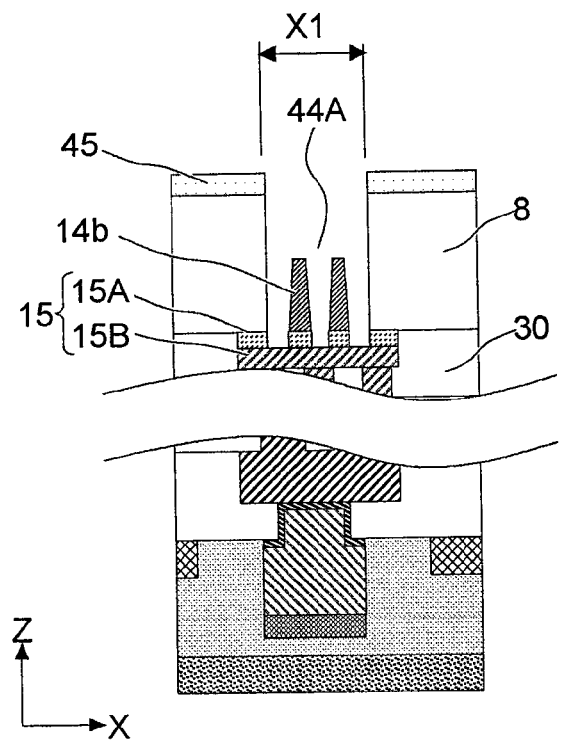
Figure 10C:
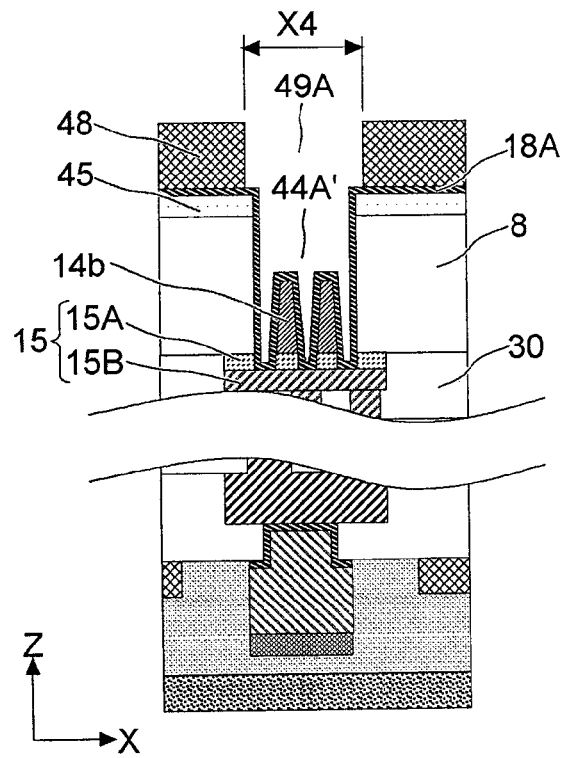

As shown in FIG. 10B, insulating film 45 exposed at the bottom of first opening 47A, and silicon substrate 8 serving as the base layer of insulating film 45, and first wiring 15A are removed by a dry etching method, so that bump hole 44A is formed. Photoresist 46 left after formation of bump hole 44A is removed by using a plasma ashing method. At this time, since the process condition, under which silicon substrate 8, and lower layer first wiring 15A made of polysilicon are dry-etched, is a high selective etching condition for silicon, STI 14 formed of a silicon nitride film and upper layer first wiring 15B made of tungsten are not removed, and hence STI 14 is left in bump hole 44A. Further, STI 14 serves as an etching protection film, and hence lower layer first wiring 15A under STI 14 is also left. Thereby, protruding portion 14b is formed.

A plurality of protruding portions 14b are arranged in a grid shape in the X and Y directions as shown in FIG. 11, and are erected in bump hole 44A in a state where the upper and side surface portions of protruding portions 14b are exposed. Each of the dimensions X2 and Y2 of protruding portion 14b is set to 0.35 μm, and each of the intervals X3 and Y3 between protruding portions 14b is set to 0.45 μm. However, each of the dimensions can also be reduced to a dimension that is the same as the dimension of the STI provided in semiconductor element area 10. Bump hole 44A is formed in a substantially circular shape in which X1=Y1, but the shape of bump hole 44A is not limited to this. Bump hole 44A may also be formed in an elliptical shape in which X1 is different from Y1, and also bump hole 44A may be formed in a polygonal shape, such as a quadrangular shape and a hexagonal shape. The side surface portion of lower layer first wiring 15A and a part of the surface of upper layer first wiring 15B are exposed in the bottom of bump hole 44A. Note that, as shown in FIG. 12, protruding portion 14b may be arranged so as to extend in the Y direction, and also in this case, protruding portions 14b are erected in bump hole 44A in a state where the upper surface portion and the side surface portion of protruding portion 14b are exposed. Also in FIG. 12, the dimension X2 of protruding portion 14b is set to 0.35 μm, and the dimension Y4 of protruding portion 14b is set to 6.5 μm. The interval X3 between protruding portions 14b is set to 0.45 μm, and the bottom surface of bump hole 44A is also formed similarly to that of FIG. 11. Note that STI 14 configuring protruding portion 14b is not only formed in the area of bump hole 44A as shown in FIG. 11 and FIG. 12, but also may be formed in an area outside the area of bump hole 44A.

As shown in FIG. 100, by using a sputtering method, first seed film 18A, in which titanium (Ti) and copper (Cu) are stacked together, is formed so as to cover bump hole 44A. First seed film 18A covers bump hole 44A and also uniformly covers the exposed surfaces of the upper and side surfaces of STI 14, the side surface of lower first wiring 15A, and the upper surface of upper first wiring 15B. New bump hole 44A' is formed by this sputtering method.

Next, photoresist 48 is applied to the upper surface of first seed film 18A, and second opening 49A is formed by a photolithography method.

Second opening 49A is arranged so as to expose bump hole 44A', and opening dimension X4 of second opening 49A is set to 12 μm which is larger than first opening dimension X1.

Figure 10D:
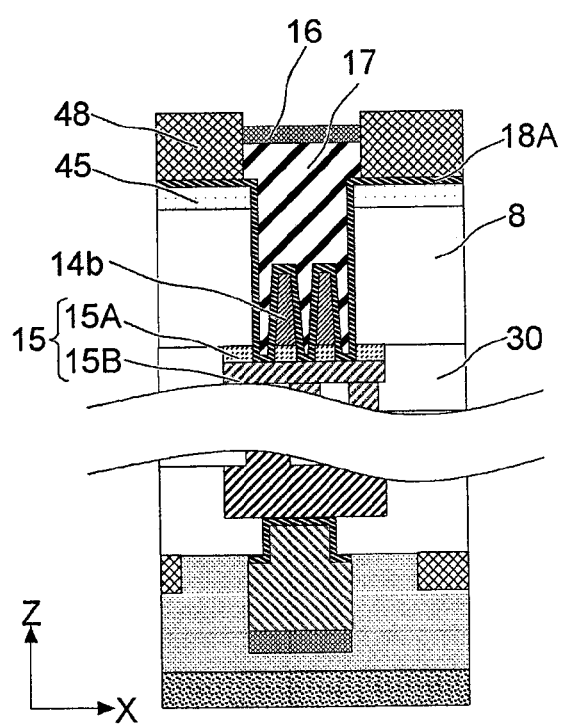

As shown in FIG. 10D, in bump hole 44A' and second opening 49A, rear bump 17 made of copper (Cu), and rear plating layer 16 in which nickel Ni) and gold (Au) are stacked together are formed by an electroplating method. At this time, first seed film 18A in contact with rear bump 17 thoroughly covers the inside of bump hole 44A and protruding portion 14b, and hence the plating solution of rear bump 17 is uniformly wet-spread on the surface of first seed film 18A. Therefore, even when protruding portion 14b is erected, rear bump 17 including no air bubble (void) can be formed.

Next, photoresist 48 is removed by a wet etching method. Further, in order to leave only first seed film 18 under rear bump 17, unnecessary first seed film 18A on insulating film 45 is removed by a wet etching method, and then TSV 7 shown in FIG. 2B is completed.

Figure 14:
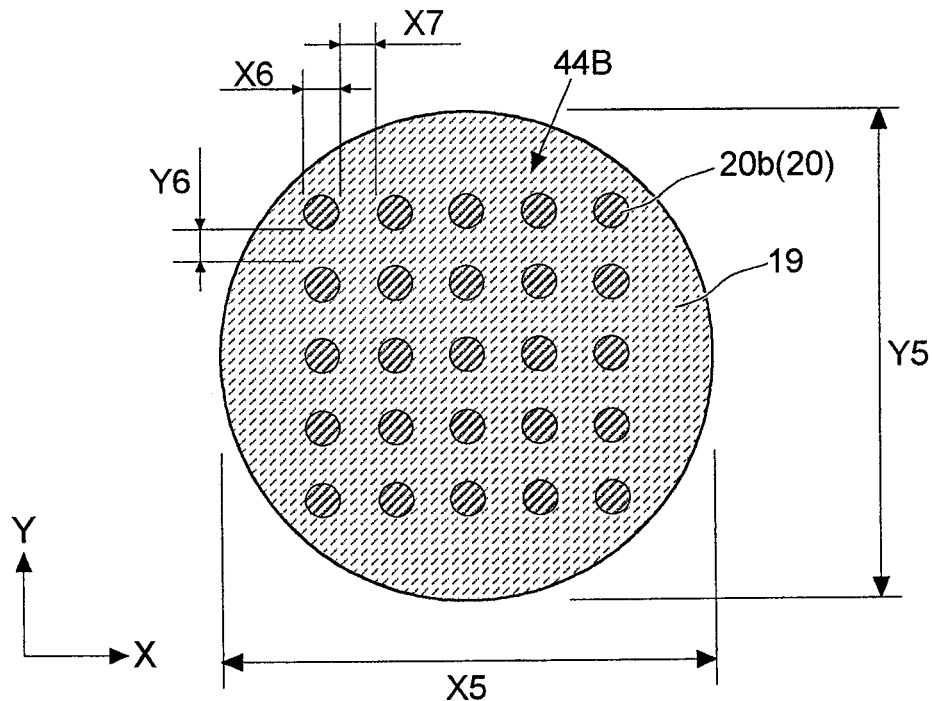
FIG. 14 is a view showing an example of arrangement of protruding portion 20b (first contact plug 20) in the plan view of the inside of bump hole 44B of FIG. 13B.
Figure 15:
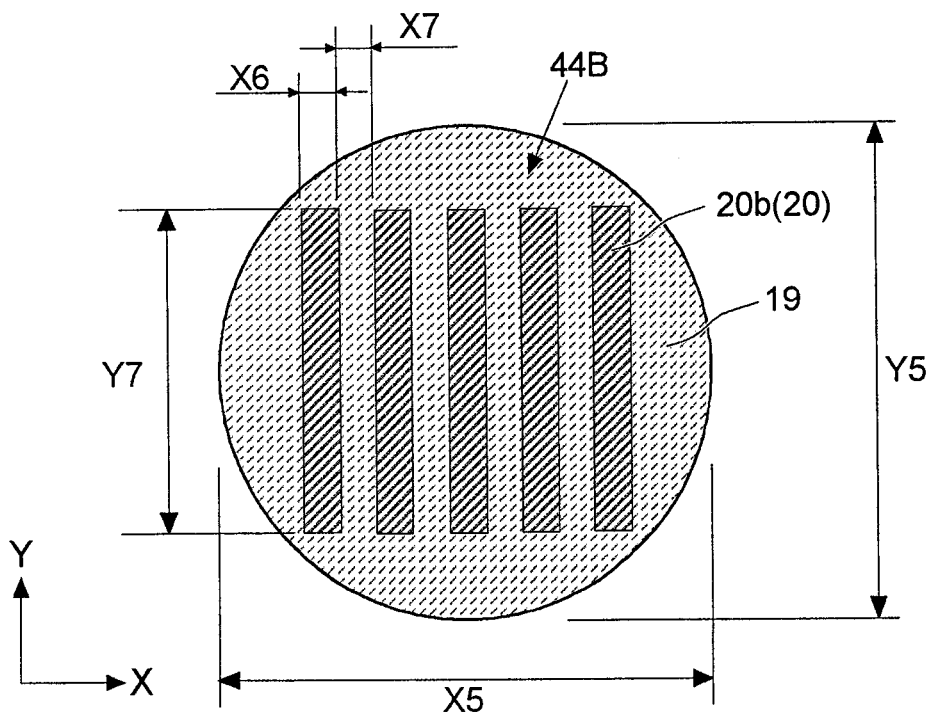
FIG. 15 is a view showing another example of arrangement of protruding portion 20b (first contact plug 20) in the plan view of the inside of bump hole 44B of FIG. 13B.

Next, manufacturing steps of the rear bump in semiconductor device 400 according to the third exemplary embodiment will be described with reference to FIG. 13 to FIG. 15.

Each of FIG. 13A to FIG. 13E is a cross-sectional view which shows each of the manufacturing steps of semiconductor device 400 shown in the third exemplary embodiment, and which shows TSV area 11 in FIG. 8. In order to explain the manufacturing process of rear bump 17 configuring the TSV of semiconductor device 400, each of these cross-sectional views is illustrated so that the rear surface of silicon substrate 8 faces upward. Further, the configuration above capacitive pad 19 (under capacitive pad 19 in FIG. 13) is the same as the configuration in FIG. 10, and hence the illustration of the configuration in this portion is omitted. Each of FIG. 14 and FIG. 15 shows an example of arrangement of protruding portions 20b each configured by first contact plug 20 in the plan view of TSV area 11 in the middle of manufacture of rear bump 17.

As shown in FIG. 13A, a plurality of first contact plugs 20 provided simultaneously with first contact plugs 20 in the semiconductor element area 10 are arranged in first interlayer insulating film 30 and are connected to capacitive pad 19. Insulating film 45 which is a silicon nitride film is formed on the rear surface of silicon substrate 8. Further, photoresist 46 is applied on insulating film 45, and first opening 47B having a circular shape in the plan view is formed by a photolithography method. The opening dimension X5 of first opening 47B is set to 11 μm. A part of insulating film 45 is exposed at the bottom of first opening 47B. Note that the manufacturing method of semiconductor device 400 according to the third exemplary embodiment is the same as the manufacturing method described with reference to FIG. 10 except that first wiring 15 is not formed.

As shown in FIG. 13B, insulating film 45 exposed at the bottom of first opening 47B, and silicon substrate 8 serving as the base layer of insulating film 45, and first interlayer insulating film 30 are removed by a dry etching method, so that bump hole 44B is formed. Photoresist 46 left after the formation of bump hole 44B is removed by a plasma ashing method. At this time, since the process condition, under which first interlayer insulating film 30 formed of a silicon oxide film is dry-etched, is a high selective etching condition for the silicon oxide film, first contact plug 20 made of tungsten cannot be removed and hence is left as protruding portion 20b in bump hole 44B. As shown in FIG. 14, a plurality of protruding portions 20b are arranged in a grid shape in the X and Y directions and are erected in substantially circular bump hole 44B having dimensions of X5=Y5 in a state where the upper and side surface portions of protruding portion 20b are exposed. The diameter dimension X6 of protruding portion 20b is set to 0.35 μm, and the intervals X7 and Y6 between protruding portions 20b is set to 0.45 μm. However, each of the dimensions can also be reduced to a dimension that is the same as the dimension of first contact plug 20 provided in semiconductor element area 10. A part of the upper surface of capacitive pad 19 is exposed in the bottom of bump hole 44B. Note that, as shown in FIG. 15, protruding portion 20b may be arranged so as to extend in the Y direction, and also in this case, protruding portions 20b are erected in bump hole 44B in a state where the upper and side surface portions of protruding portion 20b are exposed. Also in FIG. 15, the dimension X6 of protruding portion 20b is set to 0.35 μm, and the dimension Y7 of protruding portion 20b is set to 6.5 μm. The interval X7 between protruding portions 14b is set to 0.45 μm, and the bottom surface of bump hole 44B is formed similarly to FIG. 14. Note that first contact plug 20 configuring protruding portion 20b is not only formed in the area of bump hole 44B as shown in FIG. 14 and FIG. 15, but also may be formed in an area outside the area of bump hole 44B.

Figure 13C:
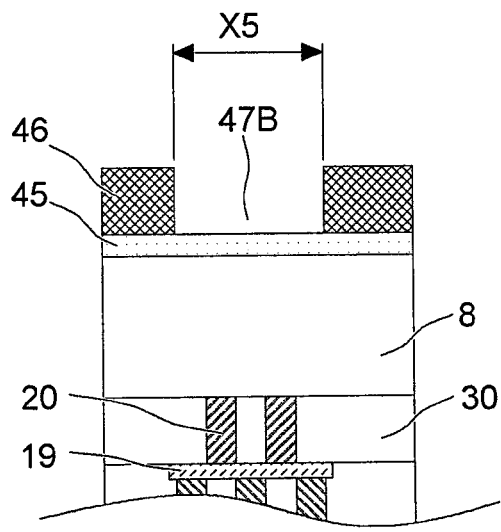
Figure 13C:
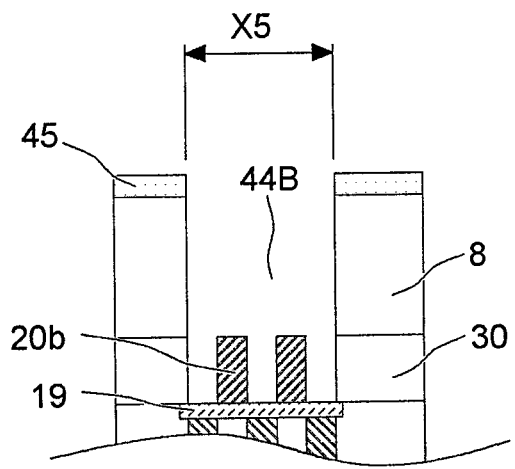
Figure 13C:
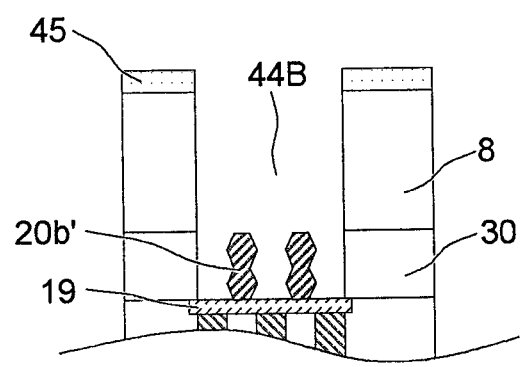

Next, as shown in FIG. 13C, the surfaces (upper and side surfaces) of protruding portion 20b formed of first contact plug 20 and exposed in bump hole 44B are etched by a wet etching method using hydrogen peroxide solution ($H_2O_2$/$H_2O$) as etching solution. The hydrogen peroxide solution dissolves tungsten constituting protruding portion 20b and also enters the grain boundaries of tungsten to liberate, into the etching solution, tungsten particles in the surface of protruding portion 20b. Thereby, the surface of protruding portion 20b is roughened due to the liberation of tungsten particles so that protruding portion 20b' having an uneven surface is formed after the etching.

Note that, when the process of next step is performed without performing the wet etching process, semiconductor device 300 of the second exemplary embodiment, which has protruding portion 20b formed of first contact plug 20, can be manufactured.

Figure 13D:
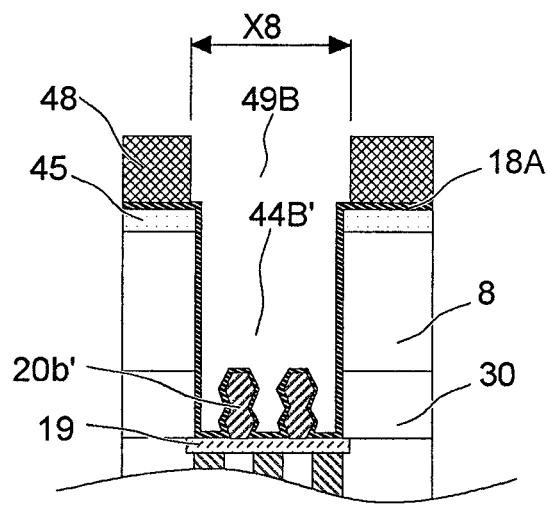

As shown in FIG. 13D, first seed film 18A, in which titanium (Ti) and copper (Cu) are stacked together, is formed by a sputtering method so as to cover bump hole 44B. First seed film 18A covers bump hole 44B and also uniformly covers the exposed upper and side surfaces of protruding portion 20b' and the upper surface of capacitive pad 19. New bump hole 44B' is formed by the sputtering process. Second opening 49B formed in photoresist 48 is arranged so as to expose bump hole 44B'. The opening dimension X8 of second opening 49B is set to 12 μm which is larger than the first opening dimension X5. Note that the other manufacturing steps are the same as those of FIG. 100, and hence the description thereof is omitted.

Figure 13E:
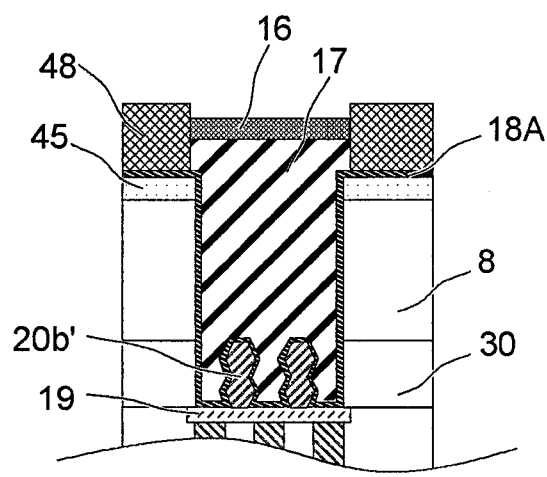

As shown in FIG. 13E, by an electroplating method, rear bump 17 made of copper (Cu), and rear plating layer 16 in which nickel (Ni) and gold (Au) are stacked together are formed in the inside of bump hole 44B' and second opening 49B. At this time, first seed film 18A in contact with rear bump 17 thoroughly covers the inside of bump hole 44B' and the surface of protruding portion 20b', and hence the plating solution of rear bump 17 is uniformly wet-spread on the surface of first seed film 18A. Therefore, even when protruding portion 20b' is erected, rear bump 17 including no air bubble (void) can be formed. Note that the other manufacturing steps are the same as those of FIG. 10D, and hence the description thereof is omitted.

Another embodiment of the present invention includes the following semiconductor device manufacturing method.

I. A manufacturing method of a semiconductor device having a semiconductor element area in which a semiconductor element is formed, and a through electrode area which penetrates a substrate separated from the semiconductor element area, the manufacturing method including:

forming the semiconductor element in the semiconductor element area on a first surface of a semiconductor substrate, forming an interlayer insulating film covering the first surface of the semiconductor substrate, forming an interconnection in the interlayer insulating film of the through electrode area, forming, on the interlayer insulating film, a second bump which is connected to the interconnection, and which is exposed to the side of the first surface, grinding the semiconductor substrate from the side of a second surface facing the first surface so as to reduce the thickness of the semiconductor substrate, forming a bump hole which penetrates the semiconductor substrate from the side of the second surface and exposing a part of the interconnection, and forming, in the bump hole, a first bump exposed to the side of the second surface, in which, in the forming of the bump hole, a protruding portion protruding from the side of the interconnection to the side of the second surface is formed.

II. The manufacturing method of the semiconductor device described in item I, in which the protruding portion is formed by exposing an insulating material buried on the side of the first surface of the semiconductor substrate.

III. The manufacturing method of the semiconductor device described in item II, in which the insulating material comprises silicon nitride.

IV. The manufacturing method of the semiconductor device described in item I, in which the protruding portion is formed by exposing a conductor plug formed in the interlayer insulating film on the first surface.

V. The manufacturing method of the semiconductor device described in item IV, in which the conductor plug comprises tungsten.

VI. The manufacturing method of the semiconductor device described in item IV, in which, after the conductor plug is exposed, the surface of the conductor plug is roughened into unevenness.

VII. The manufacturing method of the semiconductor device described in item I, in which, after a seed layer is formed in the bump hole, the first bump is formed by plating a conductive material.

What is claimed is:

1. A semiconductor device comprising:
    a semiconductor substrate:
    a first bump penetrating from a first surface of the semiconductor substrate to a second surface of the semiconductor substrate facing the first surface, the first bump being exposed to the side of the second surface;
    an interconnection formed on the first surface, the interconnection being connected to the first bump;
    an interlayer insulating film covering the interconnection;
    a second bump provided on the interlayer insulating film, the second bump being connected to the interconnection and exposed to the side of the first surface; and
    a protruding portion provided at a connecting portion between the first bump and the interconnection, the protruding portion fitting into the first bump.

2. The semiconductor device according to claim 1, wherein the protruding portion comprises an insulating material.

3. The semiconductor device according to claim 2, wherein the insulating material comprises the same material of an element isolation insulating film partitioning an active area in which a semiconductor element is formed on the first surface.

4. The semiconductor device according to claim 2, wherein the insulating material comprises silicon nitride.

5. The semiconductor device according to claim 2, wherein the protruding portion further comprises a conductive material on the side of connection with the interconnection.

6. The semiconductor device according to claim 2, wherein a first width of the protruding portion at the side of the interconnection is different from a second width of the protruding portion at the opposite side.

7. The semiconductor device according to claim 1, wherein the protruding portion is substantially composed of a conductive material.

8. The semiconductor device according to claim 7, wherein the protruding portion comprises the same material of a substrate contact plug connected to a semiconductor element formed on the first surface.

9. The semiconductor device according to claim 7, wherein the conductive material comprises tungsten.

10. The semiconductor device according to claim 7, wherein the surface of protruding portion fitted into the first bump is formed into an uneven shape.

11. The semiconductor device according to claim 1, wherein a plurality of the protruding portions are arranged in a grid shape in the connecting portion between the first bump and the interconnection.

12. The semiconductor device according to claim 1, wherein the protruding portion is arranged in a line shape in the connecting portion between the first bump and the interconnection.

13. A semiconductor package comprising a plurality of the semiconductor devices according to claim 1 that are stacked together by connecting the first bump and the second bump to each other.

14. A semiconductor device comprising:
    a semiconductor substrate;
    a through-via penetrating from a first surface of the semiconductor substrate to a second surface of the semiconductor substrate facing the first surface, the through-via having a subdivided inner terminal formed in a convexo-concave shape;
    an interconnection formed on the first surface of the semiconductor substrate, the interconnection being in contact with at least a convex portion of the subdivided inner terminal of the through-via in a connecting portion between the through-via and the interconnection;
    an interlayer insulating film covering the interconnection; and
    a fitting member provided on the lowermost portion of the interconnection, the fitting member being embedded in a concave portion of the subdivided inner terminal of the through-via.

15. The semiconductor device according to claim 14, wherein the fitting member comprises an insulating material.

16. The semiconductor device according to claim 15, wherein the fitting member further comprises a conductive material on the side of connection with the interconnection.

17. The semiconductor device according to claim 14, wherein the fitting member comprises a conductive material that is electrically connected to the interconnection.

18. The semiconductor device according to claim 17, wherein the fitting member has an uneven surface.

19. The semiconductor device according to claim 14, wherein a plurality of the fitting members are arranged in a grid shape in the connecting portion between the through-via and the interconnection.

20. The semiconductor device according to claim 14, wherein the fitting member is arranged in a line shape in the connecting portion between the through-via and the interconnection.

* * * * *